United States Patent [19]

Vinson

[11] 4,078,215

[45] Mar. 7, 1978

[54] ELECTRONIC FILTER CIRCUIT

[75] Inventor: Billy Herman Vinson, Simi Valley, Calif.

[73] Assignee: Altec Corporation, Anaheim, Calif.

[21] Appl. No.: 745,448

[22] Filed: Nov. 26, 1976

[51] Int. Cl.² .................. H03H 7/10; H03H 7/14; H03F 1/32; H03G 9/20

[52] U.S. Cl. ................. 333/70 R; 330/103; 330/108

[58] Field of Search .............. 333/70 R, 28 R, 28 T, 333/81 R, 76; 330/103, 104, 107, 108, 109; 328/167

[56] References Cited

U.S. PATENT DOCUMENTS

| 2,907,838 | 10/1959 | Ross | 333/28 R |
| 4,002,994 | 1/1977 | Fender | 330/109 |

Primary Examiner—Eli Lieberman
Assistant Examiner—Marvin Nussbaum
Attorney, Agent, or Firm—Edward A. Sokolski

[57] ABSTRACT

An electronic filter circuit having controlled "Q" with variations in attenuation. A plurality of filter networks are connected in parallel between the output and the input of an amplifier in a manner such as to be capable of selectively providing negative feedback to the amplifier. Each filter network includes inductive, capacitive and resistive elements, with a potentiometer forming part of the resistance thereof. Each potentiometer is connected in series with a resistor having the same value thereas, the arm of the potentiometer being connected to its associated filter network such that the "cut" to which the potentiometer is set determines the total value of the resistance presented by the filter network in the feedback circuit. The potentiometers and associated resistors are each connected in series with each other, these series connected elements being connected in parallel between the input and the output of a unity gain amplifier. With the potentiometers in the "flat" positions, the feedback signals are zero and thus have no effect on the output of the main amplifier. Various amounts of frequency responsive attenuation are provided by various settings of selected potentiometers.

4 Claims, 2 Drawing Figures

ELECTRONIC FILTER CIRCUIT

This invention relates to electronic filter circuits and more particularly to such a circuit employing negative feedback through passive filter elements in its implementation wherein the frequency response with changes in attenuation can be controlled as desired.

In passive type filter circuits of the prior art which employ a plurality of paralleled filter networks connected in the feedback circuit of an amplifier, it has been found that filter networks with their attenuator settings at "zero" or a small cut can affect the frequency response of the amplifier in an uncontrolled and undesirable manner. This is usually manifested by the appearance of "humps" or small peaks in the response curve on both sides of the maximum attenuation dip. These undesirable peaks have been minimized in certain prior art circuits but only at a serious sacrifice of amplifier "Q".

The present invention provides means for eliminating the aforementioned shortcoming of the prior art in a simple yet highly effective manner without sacrificing the "Q" characteristics of the amplifier.

It is therefore an object of this invention to facilitate the control of the attenuation characteristics of a passive filter circuit.

It is another object of this invention to provide a passive filter circuit in which the circuit "Q" can be accurately controlled without undesirable effects.

Other objects of this invention will become apparent as the description preceeds in connection with the accompanying drawings, of which:

It is to be noted that "Q" characteristics of the circuit of the invention can be controlled in a desired manner to provide a "Q" which changes with changes in attenuation, as application requirements may dictate.

Briefly described, the circuit of my invention is as follows:

A plurality of filter units are connected in parallel with each other between the output and the input of an inverting main amplifier. Each of these filter units may include capacitive, inductive, and resistive elements and as a portion of the resistance thereof, a potentiometer. The potentiometer of each unit is connected in series with a resistor having a resistance equal to the total resistance of its associated potentiometer. The potentiometers and last mentioned resistors of each unit are connected in parallel with each other and between the output and input of an inverting unity gain amplifier. The arm of each potentiometer is connected to the remaining active elements of its associated filter unit with one end of the potentiometer being connected to the output of the main amplifier and the other end of each potentiometer being connected to its associated resistor. Thus, with any potentiometer arm set to "zero" (i.e., turned to the position where there is no resistance between such arm and the associated resistor), no signal will be fed from the output of the main amplifier to the associated filter unit thereby having no effect on the frequency response characteristics of this amplifier. On the other hand, with any one of the potentiometers set away from the "zero" position, various amounts of signal will be fed from the output of the amplifier to the associated filter unit to the input of the amplifier, thereby affecting the frequency response characteristics of the amplifier accordingly.

Figure 1:
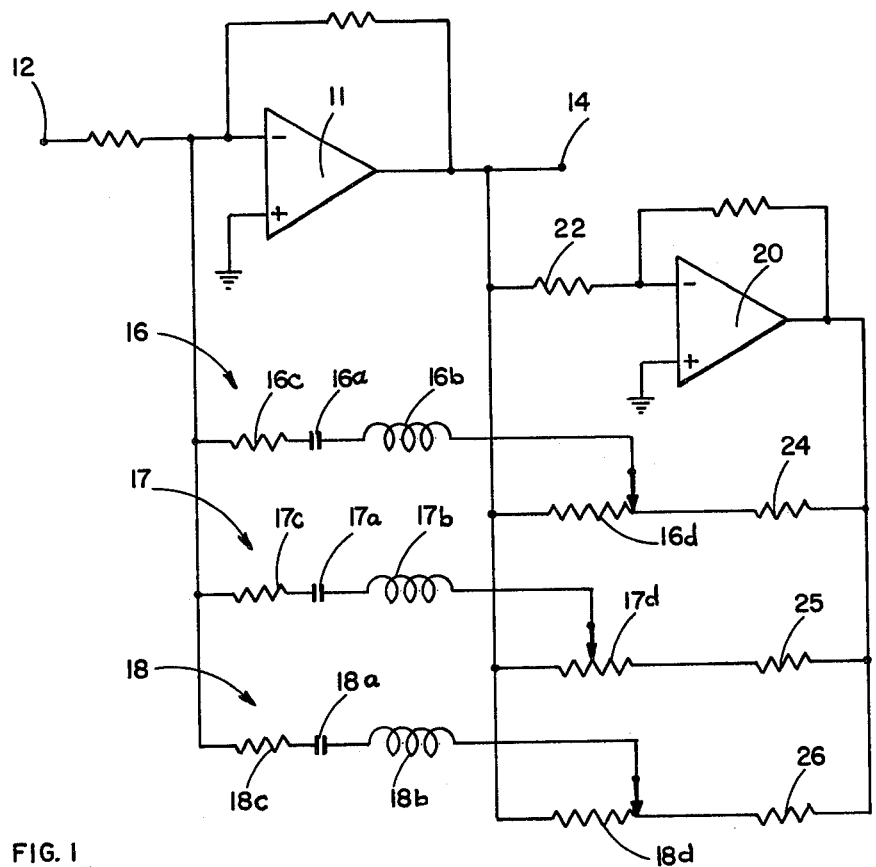
FIG. 1 is a schematic drawing of a preferred embodiment of the invention.

Referring now to FIG. 1, a preferred embodiment of the circuit of the invention is schematically illustrated. Amplifier 11 is an inverting amplifier and receives input signals at terminal 12 and provides output signals at terminal 14. A negative feedback signal is fed from the output of amplifier 11 to one or more of filter units 16–18. Each of filter units 16–18 respectively includes a capacitive element 16a–18a, an inductive element 16b–18b, a fixed resistive element 16c–18c and a potentiometer 16d–18d, the elements for each unit being connected in series with each other. It is to be noted that in the case of the potentiometers, one end of each potentiometer is connected to the output of amplifier 11 while the arm of the potentiometer is connected to an associated inductive element.

An input terminal of unity gain inverting amplifier 20 is connected through input resistor 22 to the output of amplifier 11. Connected between the input of amplifier 20 (through resistor 22) and the output of this amplifier are a group of parallel connected voltage dividers formed by potentiometers 16d–18d and resistors 24–26 respectively. Resistors 24–26 have resistances which are equal to that of their associated potentiometers (as measured between the ends of the potentiometers). Thus, when the arms of the potentiometers are rotated fully to the ends thereof which are connected to the associated resistors, these arms are tapping at the midpoint of their associated voltage dividers. The voltage at the midpoint of any divider is always zero in view of the connection of the dividers between the output and input of inverting amplifier 20. Thus when any of the potentiometers are set to this midpoint position, which may be termed the "zero" position, no negative feedback signal is fed through the associated filter unit to the input of amplifier 11 (as shown in FIG. 1 for filter unit 16 and 18). However, when the arm of any potentiometer is adjusted away from this "zero" position (as shown for filter unit 17 in FIG. 1), a negative feedback signal is provided through the associated filter unit having a magnitude in accordance with the position of the potentiometer arm in question. It should be apparent that in view of the fact that no negative feedback signal is provided to amplifier 11 through filter units the potentiometers of which are set at the "zero" position, that these filter units will have no effect on the frequency response of the amplifier circuit.

Figure 2:
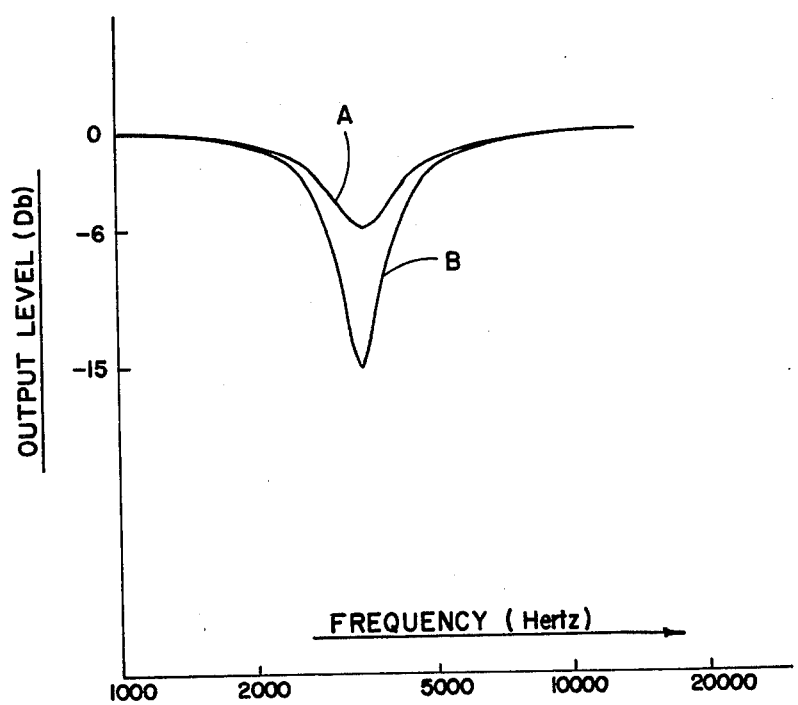
FIG. 2 is a graphical illustration showing the response characteristics of the preferred embodiment.

Referring now to FIG. 2, typical "Q" curves for the preferred embodiment of the invention are shown. Curve A is a "Q" curve with a particular filter unit set to provide a maximum of 6db of attenuation, while curve B illustrates the output with this same attenuator unit set to provide 15db attenuation. It can be seen that the "Q" varies from about 3 at 6db attenuation to about 8 at 15db attenuation. The "Q" thus can be controlled to vary in a predetermined manner by providing predetermined resistances in the circuit as the attenuation is varied. The circuit of this invention thus provides a simple yet highly effective means for controlling the frequency response in a passive filter circuit as the attenuation provided thereby is varied, without interaction from other filters in the same circuit.

While the invention has been described and illustrated in detail, it is to be clearly understood that this is intended by way of illustration and example only and is not to be taken by way of limitation, the spirit and scope of this invention being limited only by the terms of the following claims.

I claim:
1. A filter circuit for selectively filtering the output of an amplifier comprising:
    a plurality of passive filter units connected in parallel between an inverting output and the input of the amplifier, each of said filter units including a variable resistor, the variable tap and one end of each of said variable resistors being connected between the inverting output of the amplifier and the remaining elements of the associated filter unit,
    a unity gain amplifier, the input of said unity gain amplifier being connected to the inverting output of said first mentioned amplifier; and
    a fixed resistor connected between the other end of each of said variable resistors and an inverting output of said unity gain amplifier, the resistance of each of said resistors being equal to that between the ends of its associated variable resistor, whereby the voltages at the connections between the other ends of said variable resistors and said fixed resistors is held to zero by said unity gain amplifier.

2. The circuit of claim 1 wherein said filter units comprise resistive, capacitive and inductive elements connected in series with each other.

3. The circuit of claim 1 wherein the variable tap of each of said variable resistors is connected to the remaining elements of the associated filter unit, said one ends of said variable resistors being connected to the inverting output of the amplifier.

4. The circuit of claim 1 wherein said variable resistors are potentiometers, said variable taps comprising the arms of said potentiometers.

* * * * *